US010756732B2

(12) United States Patent
Mahler (10) Patent No.: US 10,756,732 B2
(45) Date of Patent: Aug. 25, 2020

(54) INDUCTIVE SENSOR AND METHOD FOR OPERATING AN INDUCTIVE SENSOR

(71) Applicant: BALLUFF GmbH, Neuhausen (DE)

(72) Inventor: Simon Mahler, Suberg (CH)

(73) Assignee: BALLUFF GmbH, Neuhausen (DE)

( * ) Notice: Subject to any disclaimer, the term of this patent is extended or adjusted under 35 U.S.C. 154(b) by 0 days.

(21) Appl. No.: 16/289,846

(22) Filed: Mar. 1, 2019

(65) Prior Publication Data

US 2019/0280690 A1    Sep. 12, 2019

(30) Foreign Application Priority Data

Mar. 12, 2018  (DE) .................. 10 2018 105 590

(51) Int. Cl.
*H03K 17/95*    (2006.01)

(52) U.S. Cl.
CPC ......... *H03K 17/954* (2013.01); *H03K 17/951* (2013.01); *H03K 17/9537* (2013.01); *H03K 17/9547* (2013.01); *H03K 2217/0036* (2013.01); *H03K 2217/94042* (2013.01)

(58) Field of Classification Search
CPC .............. H03K 17/954; H03K 17/951; H03K 17/9547; H03K 17/9537; H03K 2217/94042; H03K 2217/0036; H03K 17/9542
See application file for complete search history.

(56) References Cited

U.S. PATENT DOCUMENTS

| 4,540,899 | A | 9/1985 | Pelly |
| 6,335,619 | B1* | 1/2002 | Schwab ............... G01D 3/036 |
| | | | 324/207.12 |
| 9,147,144 | B2* | 9/2015 | Potyrailo ........... G06K 19/0717 |
| 10,451,703 | B2* | 10/2019 | Condorelli ............. G01D 3/028 |
| 2014/0240008 | A1 | 8/2014 | Dornseifer et al. |

FOREIGN PATENT DOCUMENTS

| CN | 101187543 | 5/2008 |
| DE | 102010063749 | 6/2012 |
| EP | 0408084 | 1/1991 |

* cited by examiner

*Primary Examiner* — Jung Kim
(74) *Attorney, Agent, or Firm* — Lipsitz & McAllister, LLC (57) ABSTRACT

An inductive sensor is proposed which comprises at least one resonant circuit, an evaluation device which in a measuring phase evaluates oscillations of the at least one resonant circuit for generating sensor signals, an energy storage device, and a transfer device which in a relaxation phase of the at least one resonant circuit stores oscillation energy of the at least one resonant circuit in the energy storage device.

23 Claims, 7 Drawing Sheets

INDUCTIVE SENSOR AND METHOD FOR OPERATING AN INDUCTIVE SENSOR

The present disclosure relates to the subject matter disclosed in and claims the benefit of German application number DE 10 2018 105 590.0 filed on Mar. 12, 2018, which is incorporated herein by reference in its entirety and for all purposes.

BACKGROUND OF THE INVENTION

The invention relates to an inductive sensor.

Furthermore, the invention relates to a method for operating an inductive sensor.

Inductive sensors are used, e.g., as proximity sensors, distance sensors, or path sensors, which deliver a quantitative or qualitative result regarding, e.g., the distance of a target from the sensor.

DE 10 2010 063 749 A1 discloses an inductive proximity switch according to the impulse method with a transmitter control, a first transmitter coil, and a second transmitter coil, which are alternatingly supplied with current impulses for generating a magnetic alternating field, wherein the current impulses are produced by way of control impulses generated by the transmitter control, a receiver unit for receiving an echo signal induced from an electrically conductive target by the alternating field, an evaluation unit, and a current supply. The transmitter coils are each connected to a rectifier and a charging capacitor, wherein the transmitter coil not currently active serves for more quickly degrading the magnetic alternating field of the active transmitter coil.

US 2014/0240008 A1 discloses a system for recovering energy from a sensor, wherein a battery is coupled to an inductive device in the sensor for a time period, such that a current flows through the inductive device from the battery during the time period.

CN 101187543 A discloses an impulse coil control.

U.S. Pat. No. 4,540,899 discloses an energy provision circuit for printer hammer drive coils.

EP 0 408 084 A1 discloses a rotation detector with a rotor which has rotor angle ranges of different electromagnetic properties, and with multiple sensors arranged angularly offset.

In the book article HIMMEL, Jörg: Energieeinsparung bei der magnetisch-induktiven Durchflußmessung. Berlin [u.a.]: Springer, 1990, pp. 33-77, —ISBN 978-3-540-52620-9, possibilities for energy saving in magnetic-inductive flow measurement are described.

In the book HERING, Ekbert; SCHÖNFLEDER, Gert: Sensoren in Wissenschaft und Technik—Funktionsweise und Einsatzgebiete. First Edition. Wiesbaden: Vieweg+Teubner, 2012, 706 pages, —ISBN 978-3-8348-0169-2, the functioning and field of application of sensors is described.

SUMMARY OF THE INVENTION

In accordance with an embodiment of the invention, an inductive sensor is provided which works in an energy-efficient manner.

In accordance with an embodiment of the invention, in a sensor at least one resonant circuit is provided, an evaluation device is provided which in a measuring phase evaluates oscillations of the at least one resonant circuit for generating sensor signals, an energy storage device is provided, and a transfer device is provided which in a relaxation phase of the at least one resonant circuit stores oscillation energy of the at least one resonant circuit in the energy storage device.

In the measuring phase, oscillations are evaluated in order to generate sensor signals which qualitatively or quantitatively contain sensor information. The measuring phase is followed by a relaxation phase of oscillations of the at least one resonant circuit.

In accordance with an embodiment of the invention, the oscillation energy in the relaxation phase is at least partially stored. Useable electrical energy is thereby stored which, in turn, may be used for the operation of the inductive sensor.

If, for example, the inductive sensor has a battery device for energy supply, then the battery device may be conserved. A longer running time for the inductive sensor may be achieved.

In particular, the solution in accordance with the invention may be used for ULP-sensors. (ULP—ultra low power). Such sensors are operated with a low operating voltage of, e.g., about 1.8 V.

In accordance with an embodiment of the invention, an inductive radio sensor may be realized in a simple manner, for example, which emits its sensor signals by radio and which, e.g., is provided without an external energy supply. A long battery life may be achieved.

It is favorable if the energy storage device provides useable electrical energy to the inductive sensor. The inductive sensor may thus be operated with electrical energy from the energy storage device. A battery device may thereby be conserved, for example.

It is favorable if the at least one resonant circuit is an LC resonant circuit which is a parallel connection of an inductor and a capacitor. The inductor is the actual sensory element of the inductive sensor. An oscillator is formed by way of the LC resonant circuit, in which (voltage) oscillations are evaluable.

In a constructively simple embodiment, the energy storage device comprises at least one (buffer) capacitor or comprises at least one capacitor. Electrical energy may thus be (temporarily) stored in a simple manner. In principle, the energy storage device may also comprise, e.g., a rechargeable electrochemical cell.

It is favorable if an activation device is provided which activates the transfer device with regard to the energy storage in the energy storage device. An exact separation may thus be achieved between the measuring phase, in which oscillations are evaluated for generating sensor signals, and the relaxation phase. In the relaxation phase, oscillations are used for storing oscillation energy. The activation device then ensures that an energy recovery is carried out at an appropriate time.

It is further advantageous if a phase separation device is present which is signal-operatively connected to the activation device and which checks whether the measuring phase is completed and, when the measuring phase is detected to be completed, communicates this to the activation device, and/or which—in particular in accordance with a specification—communicates to the activation device that the relaxation phase is present. It can then be detected in an exact manner whether the measuring phase is completed. For example, it is possible due to a specification to communicate to the activation device via the phase separation device that the relaxation phase is present, because, for example, a certain number of oscillation periods was counted.

In one embodiment, the evaluation device in the measuring phase checks a voltage threshold at oscillations and counts in particular a number of oscillation periods until reaching the voltage threshold. For example, the at least one resonant circuit is excited to oscillation in an excitation phase. It is then checked by when a voltage threshold is in particular undershot. The oscillation periods occurring by then (that is, the number thereof) determines the sensor signal.

In one embodiment, a voltage increasing device is provided which in the relaxation phase effects a voltage increase in comparison to the measuring phase. As a result, a working point in the relaxation phase may be set for resonant oscillations of the at least one resonant circuit, which enables an effective energy storage in the energy storage device. The voltage increasing device may thereby form the activation device for may be separate therefrom.

It is then in particular favorable if in the measuring phase a first supply voltage is applied at the at least one resonant circuit and in the relaxation phase a second supply voltage is applied at the at least one resonant circuit, (wherein preferably the second supply voltage is greater than the first supply voltage), and in particular the second supply voltage is a full operating voltage, and for example the first supply voltage is at least approximately 50% of the second supply voltage. A measurement may thus be carried out in the measuring phase in a simple manner. Further, a working point may be set in the relaxation phase in an effective manner, which working point enables an optimized energy storage in particular in a buffer capacitor.

It is thereby advantageous if the evaluation device and/or a phase separation device which checks whether the measuring phase is completed, and/or an activation device which activates the transfer device with regard to the energy storage, and/or a voltage increasing device which in the relaxation phase effects a voltage increase at the resonant circuit are integrated into a microcontroller or ASIC. This results in a constructively simple structure with extensive control possibilities and regulation possibilities, respectively, for the inductive sensor.

It is favorable if the transfer device is separate from the microcontroller and is connected thereto. As a result, an optimized energy storage in the energy storage device may be achieved in a simple manner.

In one embodiment, the at least one resonant circuit is connected to an exciter measurement terminal and to a supply voltage terminal of a microcontroller or ASIC. As a result, the measuring phase may be initiated via an excitation phase of the at least one resonant circuit. In particular, a corresponding exciter signal is given to the at least one resonant circuit via the exciter measurement terminal. The exciter measurement terminal is then switched to high impedance, for example. An evaluation may thus be carried out in the measuring phase. Further, an optimized energy storage may be achieved by way of an increase in the voltage at the supply voltage terminal in the relaxation phase.

It is then favorable if an exciter measurement terminal of a microcontroller or ASIC to which the at least one resonant circuit is connected has high impedance in the relaxation phase and in particular outside of an excitation phase of the at least one resonant circuit. As a result, oscillations decaying after an excitation phase may be realized for the measuring phase into the relaxation phase.

The transfer device provides for the transfer of oscillation energy from the at least one resonant circuit in the energy storage device. It is favorable if the transfer device comprises a rectifier circuit and/or a control circuit which in the relaxation phase of the energy storage device provides oscillation energy at a suitable voltage level. Otherwise unused electrical energy may thus be stored in a simple manner.

In one embodiment, the rectifier circuit is connected to an exciter measurement terminal of a microcontroller, i.e. is at the same potential as the latter.

For example, the rectifier circuit comprises a Schottky diode or is one. As a result, electrical energy may be stored, for example, in a buffer capacitor in a simple manner.

In one embodiment, the control circuit comprises at least one field effect transistor as a circuit. Parasitic forward voltages may thereby be avoided.

It is then in particular favorable if the control circuit is connected to a control terminal of a microcontroller, and in particular a gate of a field effect transistor is (directly or indirectly) connected to the control terminal as a switch. It is possible to then switch through at the right time by way of the microcontroller, in order to bring about an energy storage in the energy storage device in the relaxation phase.

Provision may alternatively be made for the control circuit to be connected to an exciter measurement terminal of a microcontroller or ASIC. As a result, in principle, a pin of the microcontroller for the connection of the transfer device may be saved, i.e. the number of pins that are required for the connection of the transfer device may be kept low. Connection of the control circuit to the exciter measuring terminal of the microcontroller is hereby to be understood as these being at the same potential.

Provision is then made, for example, for the control circuit to comprise a first switch which controls a second switch, wherein the second switch is connected to the exciter measurement terminal. A switching-through may thereby be achieved in a simple manner if the relaxation phase is present with a correspondingly increased voltage.

It is then favorable if connected upstream of the first switch is an element which makes the first switch conduct only once a certain voltage threshold is exceeded. It is thereby ensured that a switching-through is only present (with energy storage) once the full operating voltage is present.

The inductive sensor is in particular configured as a ULP device. (ULP—ultra low power). Said device is operated with a relatively low operating voltage, in particular under about 2 V.

In accordance with the invention, a method of the kind stated at the outset is provided in which the inductive sensor comprises at least one resonant circuit, and in which in a measuring phase oscillations of the at least one resonant circuit are evaluated, and in which in a relaxation phase of the at least one resonant circuit oscillation energy is stored in an energy storage device.

The method in accordance with the invention has the advantages already laid out in conjunction with the inductive sensor.

Further advantageous embodiments of the method in accordance with the invention were already discussed in conjunction with the inductive sensor in accordance with the invention.

In particular, the energy storage device provides the inductive sensor in operation with electrical energy. A battery device of the inductive sensor may thereby be conserved, for example.

It is favorable if a supply voltage of the resonant circuit in the relaxation phase is raised to a working point which enables a storage of oscillation energy in an energy storage device. As a result, an effective energy storage is made possible with a relatively simple circuit arrangement.

It is also favorable if the at least one resonant circuit is connected to an exciter measurement terminal and a supply voltage terminal of a microcontroller (at the same potential), and after an excitation phase of the resonant circuit the exciter measurement terminal is switched to high impedance and in the relaxation phase the supply voltage terminal is switched to a working point for the energy storage. An effective energy storage may thereby be achieved with minimized constructive expenditure for the inductive sensor.

For example, provision may be made for oscillation energy to be provided to the energy storage device in the relaxation phase by way of rectification and/or in a controlled manner.

In one embodiment, a microcontroller controls a switch for the energy storage device. A storage of oscillation energy at the right time may thereby be made possible.

In particular, the switch is hereby a field effect transistor or comprises such a field effect transistor. A parasitic forward voltage may thereby be avoided.

For example, a rectification like by way of a Schottky diode may also take place in order to achieve an effective energy storage.

In one embodiment, a first switch controls a second switch for the energy storage device, wherein the first switch is switched by way of a voltage increase. As a result, the configuration of an additional pin to a microcontroller for the energy storage device may be avoided, for example.

It is then favorable if the first switch and/or the second switch comprises a field effect transistor.

The inductive sensor in accordance with the invention may be operated with the method in accordance with the invention and, respectively, the method in accordance with the invention may be performed on the sensor in accordance with the invention.

BRIEF DESCRIPTION OF THE DRAWINGS

The subsequent description of preferred embodiments serves in conjunction with the drawings for further explanation of the invention. In the drawings.

DETAILED DESCRIPTION OF THE INVENTION

Figure 1:
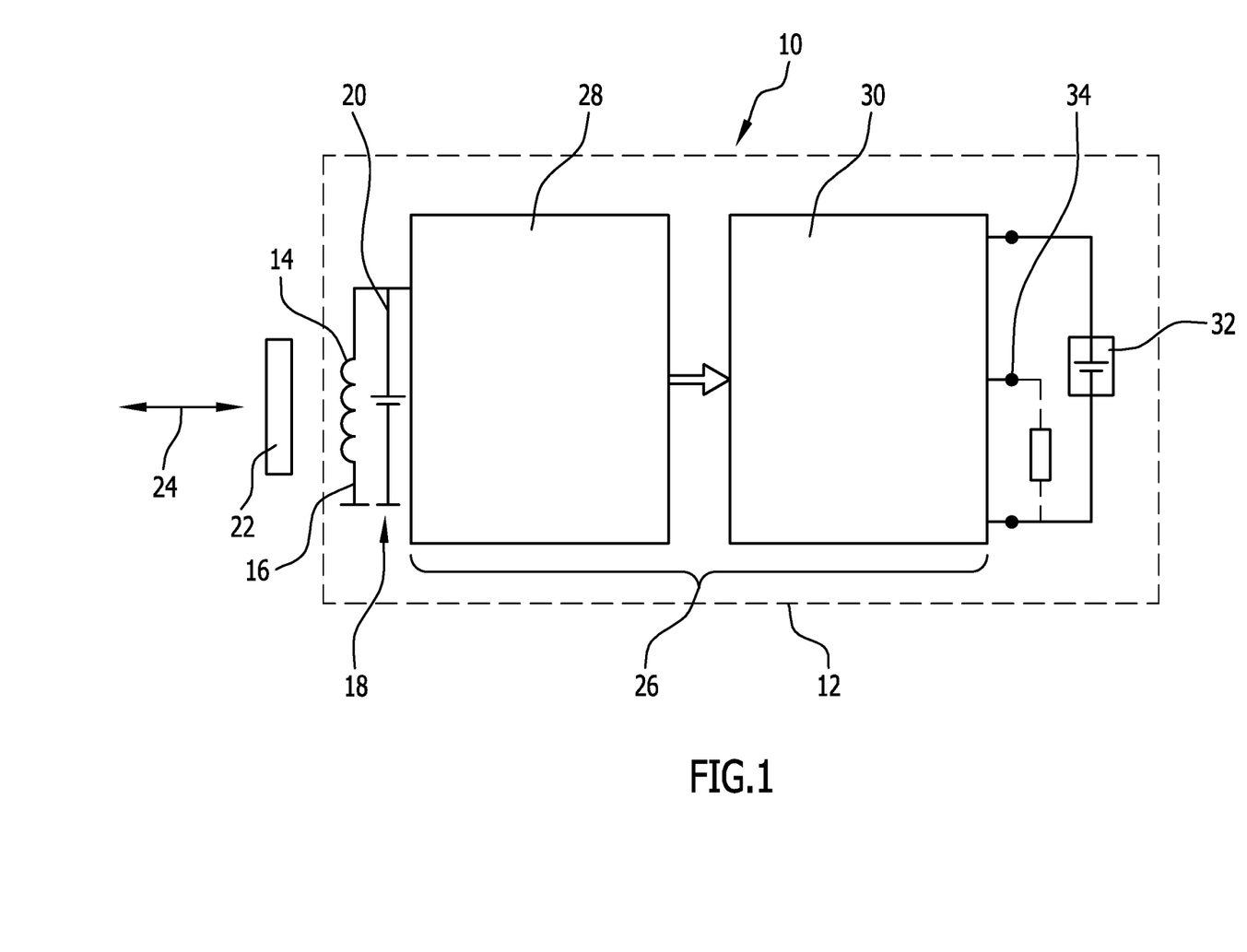
FIG. 1 shows schematically a block diagram representation of an embodiment of an inductive sensor.

One embodiment of an inductive sensor is an inductive proximity sensor (or inductive distance sensor or inductive path sensor) which is shown schematically in FIG. 1 and is referred to with 10. Said inductive sensor comprises a housing 12. (At least) one coil apparatus 16 is arranged in the housing 12 as a sensitive device 14. Said coil apparatus comprises one or more coils.

The coil apparatus 16 is integrated into a resonant circuit 18 which comprises a capacitor apparatus 20. The capacitor apparatus 20 and the coil apparatus 16 are connected in parallel. The resonant circuit 18 is an LC resonant circuit.

The sensitive device 14 responds to a (metallic) target 22. This is hereby dependent on a distance between the target 22 and the coil apparatus 16. In particular, the inductive sensor 10 and the target 22 are position-variable relative to each other in a distance direction 24. A distance change and approach in the distance direction 24, respectively, is qualitatively or quantitatively detectable.

The inductive sensor comprises an evaluation unit 26 which in particular evaluates oscillations of the resonant circuit 18. The evaluation unit 26 is arranged in the housing 12.

In one embodiment, the evaluation unit 26 has a front end 28. This front end 28 has a detector for the oscillations of the corresponding oscillator.

It is hereby possible, in principle, for the resonant circuit 18 to be an oscillator which is integrated into the front end 28, and for, e.g., a sensitive device 14 separate from the coil apparatus 16 to be present, which is coupled to said oscillator.

As the case may be, a linearization and/or temperature compensation occurs in the front end 28. Provision may further be made for the front end 28 to comprise a calibration device.

In one embodiment, a back end 30 is further provided, at which a signal conditioning occurs, for example. Further, an output stage may be provided. A protection function may be provided and a voltage regulator may be provided.

In one embodiment, the inductive sensor is configured as a ULP sensor (ULP—ultra low power). A corresponding apparatus has a very low energy consumption. For example, the corresponding sensor is operated with a low operating voltage, for example on the order of 1.8 V.

In one embodiment, the inductive sensor 10 comprises a battery device 32 for electrical energy supply in the operation of the inductive sensor 10.

The battery device 32 is arranged in the housing 12, for example.

The battery device may in principle be non-rechargeable or rechargeable. In particular in the case of a rechargeable battery device 32, a device for energy harvesting may additionally be provided, which gains energy from the vicinity of the inductive proximity sensor 10 and in particular provides for a recharging of the battery device 32.

For example, the device for energy harvesting provides solar power or thermoelectrically generated electric current.

The evaluation unit provides at one or more terminals 34 useable sensor signals which in particular qualitatively or quantitatively contain distance information regarding the distance of the target 22 in the distance direction 24 from the sensitive device 14.

The inductive sensor 10 is configured, e.g., as a radio sensor which wirelessly provides sensor signals at the terminal 34.

The sensitive device 14 is and comprises, respectively, a coil with losses, wherein said losses result from the target 22 to be detected. Further losses result from the winding, the coil core, and also from a metallic housing 12. The coil or coils of the coil apparatus 16 are excited by the sensor electronics with high-frequency current and a magnetic field is generated, the distribution and strength of which depends on the setup of the coils (in particular geometry and winding count) and on current parameters (amplitude, frequency), respectively. Said field induces eddy currents in the target 22.

The electrical losses in the target 22 depend on the strength of the magnetic field, on the material properties of the target 22, and on the distance in the distance direction 24. They lead to a change in the electrical parameters of the coil apparatus 16. The distance between the target 22 and the sensitive device 14 may in principle be qualitatively or quantitatively determined from the measuring and detecting, respectively, of such changes.

In the inductive sensor 10, the evaluation unit 26 evaluates oscillations of the resonant circuit 18. In particular, it is counted how many oscillation periods are present until the peak value of an alternating voltage reaches a certain lower voltage threshold. The number of oscillations contains the distance information.

With regard to inductive sensors, reference is made for example to "Sensoren in Wissenschaft and Technik" by E. Hering and G. Schönfelder (Publisher), Springer Fachmedien Wiesbaden 2012.

Figure 3:
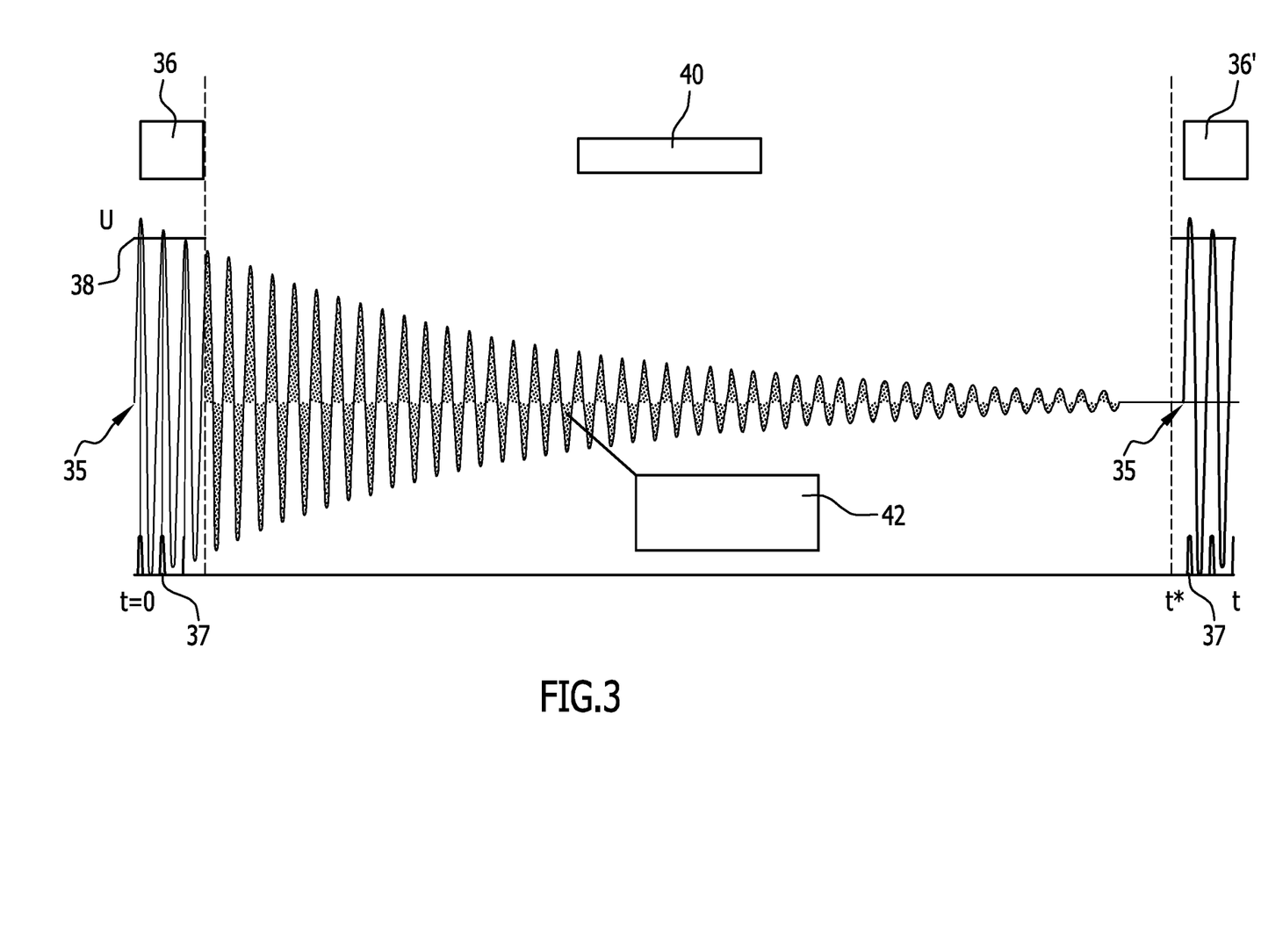
FIG. 3 shows schematically the oscillation profile on a resonant circuit of the inductive sensor in accordance with FIG. 1 with a measuring phase and a relaxation phase.

A voltage profile over the time t of oscillations of the resonant circuit 18 is shown schematically in FIG. 3. Starting at a time t=0, the resonant circuit 18 is excited in an excitation phase 35. Said excitation phase 35 typically constitutes about a quarter oscillation of the resonant circuit 18. The oscillations decay.

In a measuring phase 36, the evaluation unit 26 evaluates the oscillations.

Figure 4:
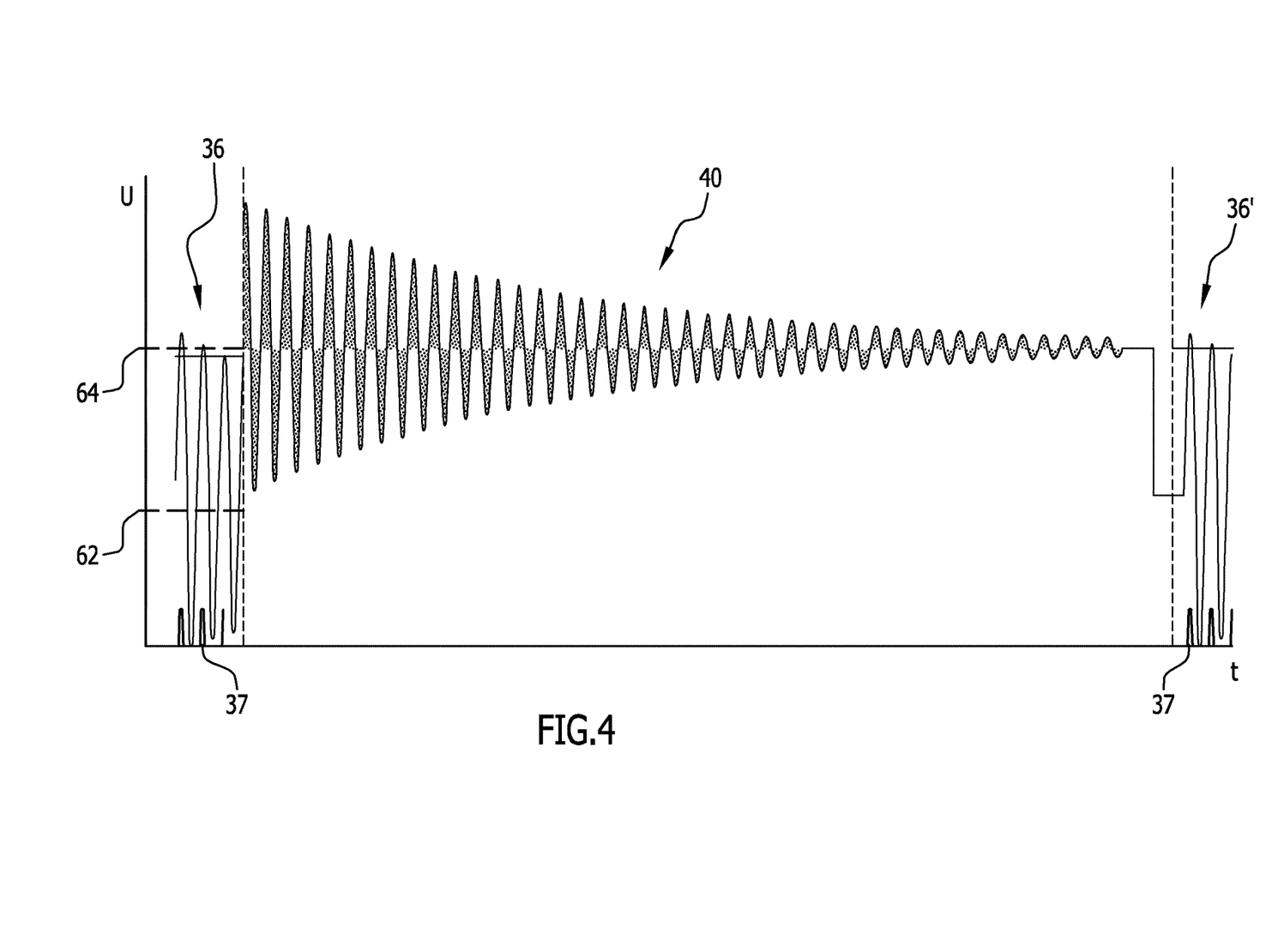
FIG. 4 shows the oscillation profile when in a relaxation phase a voltage is raised to a working point.

In one embodiment, it is checked when a voltage threshold 38 for peak voltages are undershot by oscillations. It is counted how many periods are required in this regard. Counting pulses 37 which serve for counting periods are shown in FIGS. 3 and 4. When it is detected that said voltage threshold 38 is undershot, then the measuring phase 36 is completed. In particular, the distance in the distance direction 24 may be determined from the number of oscillation periods detected (this is three oscillation periods in the schematic depiction according to FIG. 3).

The measuring phase 36 is followed by a relaxation phase 40 with decaying oscillations.

After a certain time t*, a new excitation phase 35 and subsequent measuring phase 36' takes place, which are initiated by a corresponding application of voltage to the resonant circuit 18 (the coil apparatus 16).

In accordance with the invention, provision is made for the oscillation energy to be used which is contained in the resonant circuit 18 in the relaxation phase 40 and is indicated in FIG. 3 with the reference numeral 42.

Figure 2:
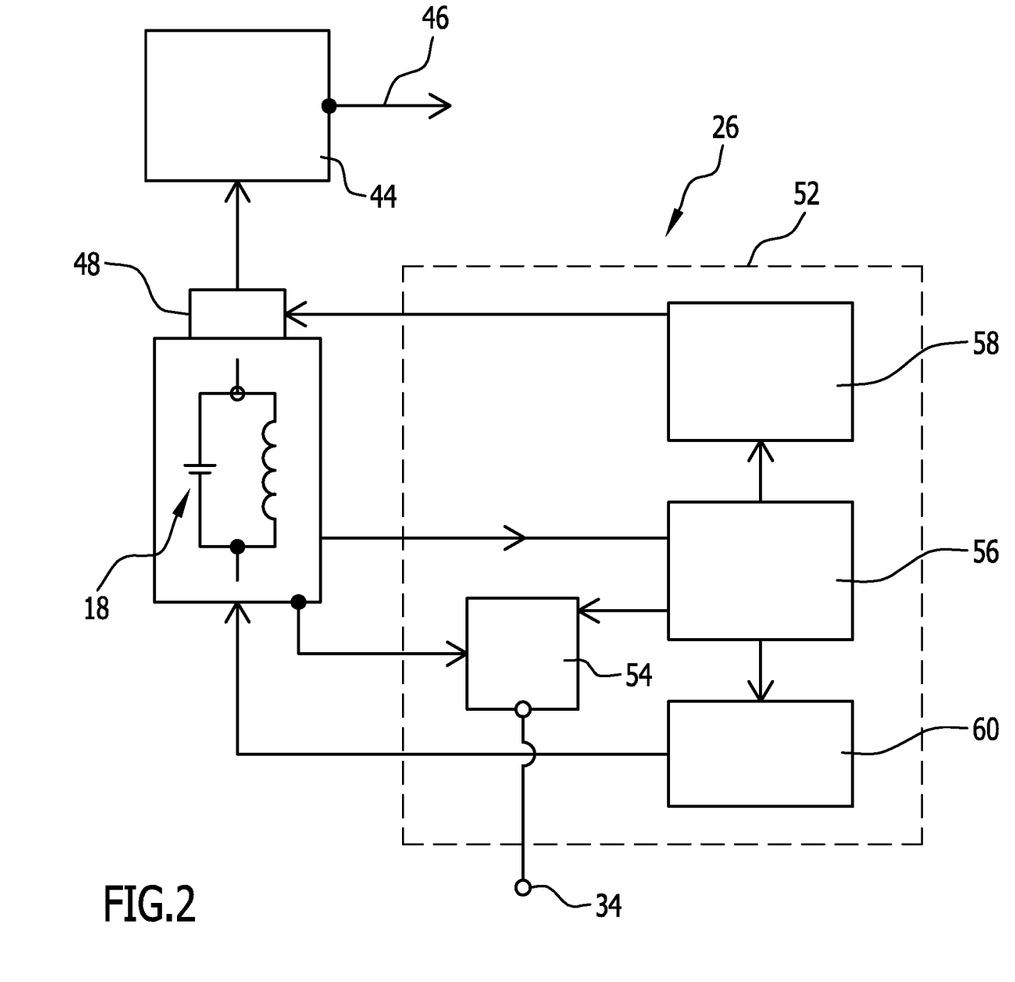
FIG. 2 shows schematically in a block diagram components of the sensor in accordance with FIG. 1 in relation to a storage of oscillation energy in a relaxation phase.

Components for the energy storage of the oscillation energy 42 in the relaxation phase 40 are schematically depicted in FIG. 2.

The inductive sensor comprises an energy storage device 44 which in particular is arranged in the housing 12.

In principle, the energy storage device 44 may be a rechargeable battery.

In one embodiment, the energy storage device 44 is formed by one or more (buffer) capacitors.

The energy storage device 44 provides useable electrical energy through the inductive sensor 10 for the operation thereof. This is indicated in FIG. 2 by the arrow with the reference numeral 46.

The inductive sensor 10 comprises a transfer device 48. This is arranged in the housing 12. The transfer device serves for bringing oscillation energy 42 in the relaxation phase 40 into the energy storage device 44. The transfer device 48 is thus coupled to the resonant circuit 18.

Embodiments for transfer devices 48 are described below.

The evaluation unit 26 comprises, e.g., a microcontroller 52 or ASIC or the like.

The evaluation unit 26 comprises, e.g., an ("actual") evaluation device 54 which is coupled to the resonant circuit 18 and correspondingly checks for the voltage threshold 38 by way of a detector and counts the corresponding periods until reaching the voltage threshold 38.

The evaluation device 54 is in particular integrated into the microcontroller 52.

The evaluation device 54 provides useable sensor signals via the terminal 34.

The evaluation unit 26 further comprises a phase separation device 56. The phase separation device 56 checks whether the oscillatory state of the resonant circuit 18 is in the measuring phase 36 or in the relaxation phase 40.

In one embodiment, the phase separation device 56 is coupled to the evaluation device 54. If, for example, the voltage threshold 38 is still not reached, then the evaluation device 54 communicates this to the phase separation device 56. This means that the resonant circuit state 18 is still in the measuring phase 36.

When the voltage threshold 38 is reached (and in particular is undershot), then the measuring phase is ended. The evaluation device 54 communicates this to the phase separation device 56, i.e. the phase separation device 56 knows that the resonant circuit state 18 is in the relaxation phase 40.

The phase separation device 56 is in particular integrated into the microcontroller 52.

By a coupling of the phase separation device 56 to the evaluation device 54, the transition from the measuring phase 36 to the relaxation phase 40 may be relatively precisely detected. As a result, a large portion of the oscillation energy 42 in the relaxation phase 40 may be used.

It is also possible in principle for the phase separation device 56, for example, to specify in accordance with an external specification that the relaxation phase 40 is reached. For example, it is automatically assumed after reaching a certain number of oscillation periods (in particular determined by the evaluation device 54) that the measuring phase 36 is completed.

The phase separation device 56 is signal-operatively coupled to an activation device 58 of the evaluation unit 26. The activation device 58 serves for activating the transfer device 48, i.e. for enabling the storage of oscillation energy in the energy storage device 44.

In particular, the phase separation device 56 communicates to the activation device 58 that the measuring phase 36 is completed and that oscillation energy of the resonant circuit 18 can now be stored. Correspondingly, the activation device 58 then activates the transfer device 48.

It is hereby also possible in principle for the activation device 58 to emit active signals to the transfer device 48, or for the resonant circuit 18, for example, to be applied with certain signals which automatically lead to a storage of oscillation energy 42 in the energy storage device 44 by way of the transfer device 48.

In one embodiment, the evaluation unit 26 comprises a voltage increasing device 60. The voltage increasing device 60 is in particular integrated into the microcontroller 52. The voltage increasing device 60 is in particular signal-operatively coupled to the phase separation device 56.

If, for example, it is recognized that the measuring phase 36 is completed, then the voltage increasing device 60 leads to an increase in a supply voltage at the resonant circuit 18, in order to set a new working point which is appropriate for the energy storage.

Shown schematically in FIG. 4 is the oscillation profile at the resonant circuit 18 when the voltage increasing device 60 is active in the relaxation phase 40.

An exciter measurement terminal of the microcontroller 52 to which the resonant circuit 18 is connected is switched to high resistance after the excitation phase 35.

In the measuring phase 36, the resonant circuit 18 is operated with a first supply voltage 62. When the end of the measuring phase 36 is detected, then the resonant circuit 18 is operated with a second supply voltage 64 which is higher than the first supply voltage 62.

As a result, a new working point, namely the second supply voltage 64 is set for the oscillations in the relaxation phase 40.

When a new measurement cycle begins with a new measuring phase 36', the first supply voltage 62 is again applied and the excitation phase 35 is initiated by applying corresponding signals at the exciter measurement terminal. The measuring phase is then initiated by the exciter measurement terminal being switched to high impedance.

The second supply voltage 64 is such that an energy storage in the energy storage device 44 by the transfer device 48 is made possible.

For example, a buck converter (downconverter and stepdown converter, respectively), connected upstream, in the inductive sensor may remain in the sleep mode for a few cycles. An energy-saving operation of the inductive sensor 10 while conserving the battery device 12 may by realized as a result.

For example, an excessive voltage increase at the energy storage device 44 and in particular at a capacitor is automatically registered there by a feedback circuit of the buck converter.

In a concrete embodiment (FIG. 5), the microcontroller 52 is operated with an operating voltage Vcc. This is at 1.8 V, for example.

Figure 5:
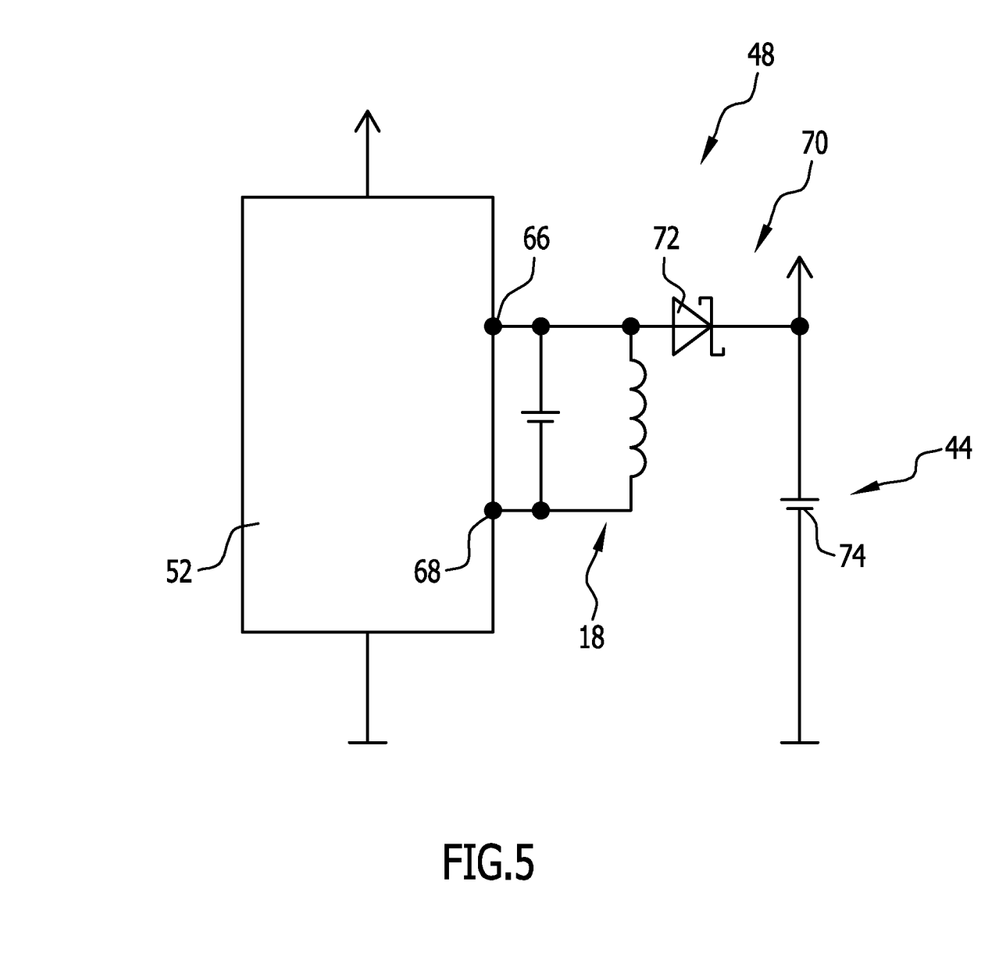
FIG. 5 shows a first embodiment of an arrangement for storing oscillation energy in a relaxation phase in an energy storage device.

The microcontroller 52 has a first terminal 66 and a second terminal 68 to which the resonant circuit 18 is connected. The first terminal 66 is an exciter measurement terminal. The second terminal 68 is a supply voltage terminal for the resonant circuit 18 ("resonant circuit supply voltage terminal").

The second terminal 68 is in particular a terminal of an internal digital-to-analog converter (DAC) of the microcontroller 52.

For the measuring phase 36, for example, the electrical energy necessary for the resonant circuit 18 to begin oscillating is briefly supplied (for initiating the measuring phase 36) at the first terminal 66. The second supply voltage 64, for example, which is Vcc/2, is applied at the second terminal 68.

After the short excitation phase, in particular the first terminal 66 is switched to high impedance.

When the end of the measuring phase 36 is detected by the phase separation device 56, then the voltage increase described above occurs by way of the voltage increasing device 60. The second supply voltage 64 and in particular Vcc is applied at the second terminal 68, for example. This results in the situation depicted in FIG. 4.

In one embodiment (FIG. 5), the transfer device 48 is formed by a rectifier circuit 70 which in particular comprises a Schottky diode 72. This correspondingly supplies electrical energy to a buffer capacitor 74 as an energy storage device 44. As a result of the corresponding peak voltages at the resonant circuit 18 in the relaxation phase 40, the buffer capacitor 74 is charged with useable electrical energy.

In this embodiment, the voltage increasing device 60 which is integrated into the microcontroller 52 also forms the activation device 58. As a result of the voltage increase, the energy storage with the transfer device 48 (with the rectifier circuit 70) is simultaneously activated.

Figure 6:
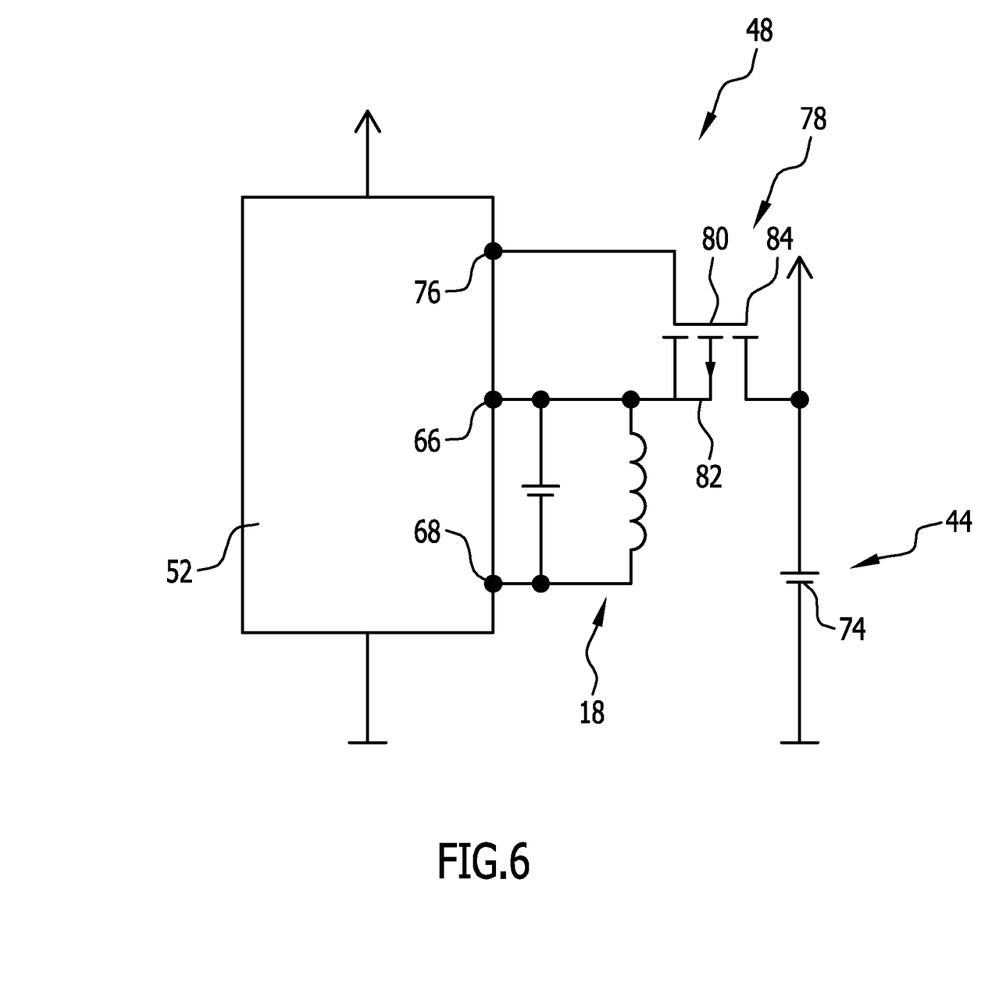
FIG. 6 shows schematically a second embodiment for energy storage.

In a second embodiment which is schematically depicted in FIG. 6, wherein the same reference numerals are used for equivalent components as in the embodiment according to FIG. 5, the microcontroller 52 comprises a third terminal 76. This third terminal 76 is a control terminal.

A transfer device 48 is provided which is formed by a control circuit 78. The control circuit 78 comprises a switch 80 which is connected to the third terminal 76. The microcontroller 52 controls by way of the third terminal 76 the switch 80 and thereby the energy storage in the energy storage device 44 in particular with buffer capacitor 74.

The third terminal 76 is part of the activation device 58.

The switch 80 is in particular formed by a field effect transistor 82. A gate 84 of said field effect transistor 82 is signal-operatively connected to the third terminal 76. Correspondingly, source terminal and drain terminal are connected to the resonant circuit 18 and the buffer capacitor 74, respectively.

The activation device 58 provides for a switching-through at the right moment and, respectively, for a switching of the switch 80 at the right moment for the energy storage.

Parasitic forward voltages which may arise at a Schottky diode 72, for example, do not apply in the case of the control circuit 78.

Figure 7:
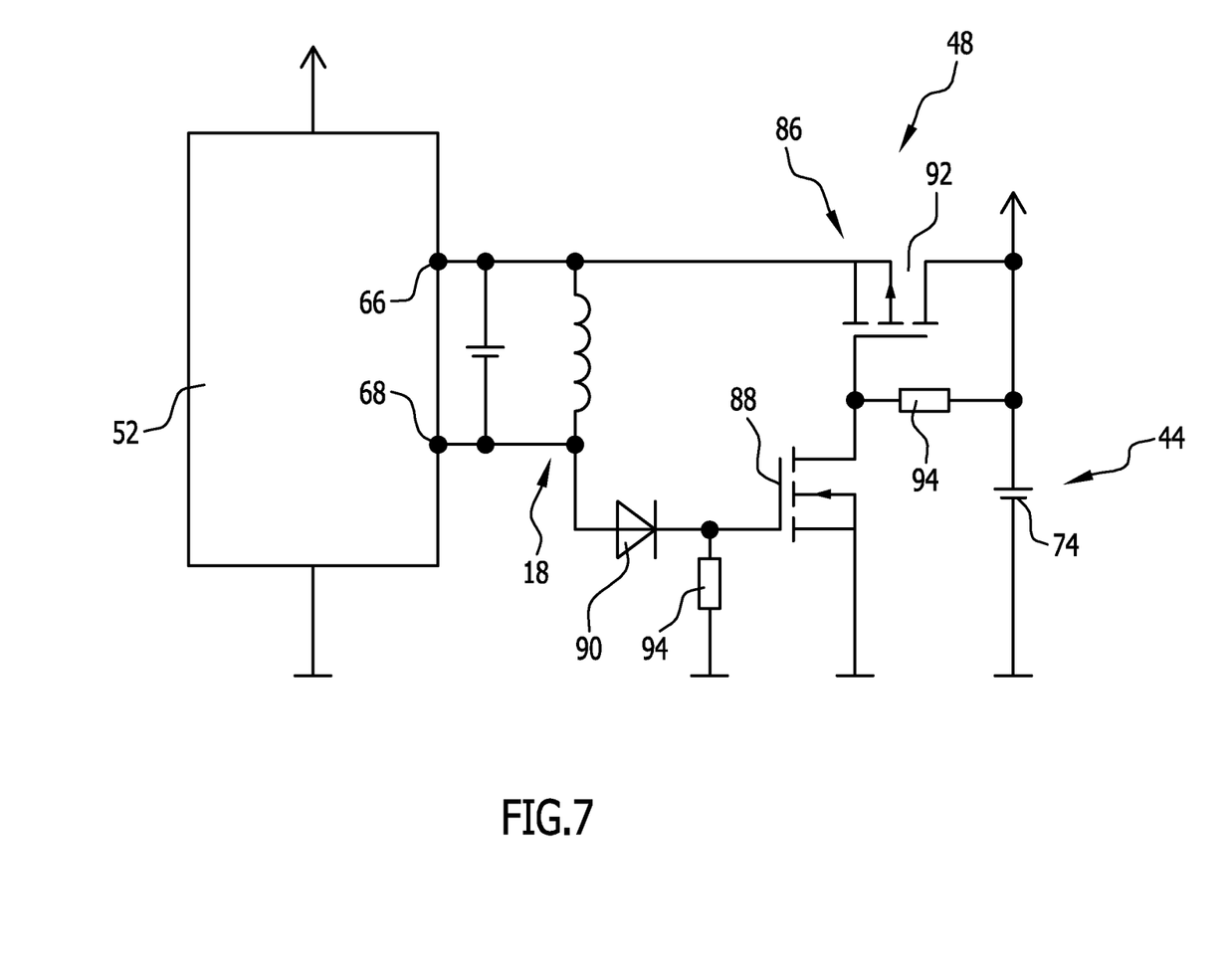
FIG. 7 shows schematically a third embodiment for energy storage.

A further embodiment of a corresponding arrangement with transfer device 48 is shown schematically in FIG. 7. The same reference numerals are used for equivalent elements as in the arrangement according to FIG. 5.

The transfer device 48 is configured as a control circuit 86. Said control circuit 86 comprises a first switch 88 which is connected to the second terminal 68 by way of an element 90. The element 90 is a diode, for example. It ensures that the first switch 88 is prevented from switching through if the full operating voltage is not being applied at the second terminal 68. For example, the element 90 provides for a voltage drop of 0.7 V.

The first switch 88 is in particular a field effect transistor, wherein a gate is connected to the second terminal 68 of the microcontroller 52 by way of the element 90.

The control circuit 86 comprises a second switch 92.

The second switch 92 is in particular a field effect transistor.

The control circuit 86 is configured such that after completion of the measuring phase 36, when the second supply voltage 64 is applied at the second terminal 68, the first switch 88 and thus also the second switch 92 switch through and thus an electrical load of the buffer capacitor 74 is made possible.

No third terminal 76 on the microcontroller 52 is required for this purpose.

Arranged between the first switch 98 and the second switch 92 on the one side, and the buffer capacitor 74 on the other side, is a first resistor 94 which has a resistance value on the order of a few megaohms.

Further, associated with the first switch 88 is a second resistor 96 which is located opposite ground and which in particular is located between ground and a gate of the first switch 88. This second resistor 96 is also of high impedance.

In accordance with the invention, an inductive sensor 10 is provided which has an extended life of the battery device 32 by way of the storage of otherwise not used oscillation energy in the relaxation phase 40 via the energy storage device 44. Electrical energy stored in the energy storage device 44 (and in particular at the buffer capacitor 74) may be used for the operation of the inductive sensor 10, and thus relieving the battery device 32.

As a result, in particular, a ULP device without external energy supply may be used longer before it needs to be replaced.

The settling voltage oscillations of the resonant circuit 18 in the relaxation phase 40 outside of measuring phases 36 are used in the solution in accordance with the invention, i.e., the corresponding oscillation energy is at least partially stored in the energy storage device 44.

REFERENCE NUMERAL LIST 10 inductive sensor
12 housing
14 sensitive device
16 coil apparatus
18 resonant circuit
20 capacitor apparatus
22 target
24 distance direction
26 evaluation unit
28 front end
30 back end
32 battery device
34 terminal
35 excitation phase
36 measuring phase
36' measuring phase
37 counting pulse
38 voltage threshold
40 relaxation phase
42 "oscillation exciter"
44 energy storage device
46 "useable electrical energy"
48 transfer device
52 microcontroller
54 evaluation device
56 phase separation device
58 activation device
60 voltage increasing device
62 first supply voltage
64 second supply voltage
66 first terminal
68 second terminal (resonant circuit supply voltage terminal)
70 rectifier circuit
72 Schottky diode
74 buffer capacitor
76 third terminal
78 control circuit
80 switch
82 field effect transistor
84 gate
86 control circuit
88 first switch
90 element
92 second switch
94 first resistor
96 second resistor

What is claimed is:

1. Inductive sensor, comprising:
a resonant circuit;
an evaluation device which in a measuring phase evaluates oscillations of the at least one resonant circuit for generating sensor signals;
an energy storage device;
a transfer device which in a relaxation phase of the at least one resonant circuit stores oscillation energy of the at least one resonant circuit in the energy storage device; and
a voltage increasing device which in the relaxation phase effects a voltage increase in comparison to the measuring phase;
wherein the relaxation phase follows the measuring phase with decaying oscillations.

2. Inductive sensor in accordance with claim 1, wherein the energy storage device provides useable electrical energy to the inductive sensor.

3. Inductive sensor in accordance with claim 1, wherein the at least one resonant circuit is an LC resonant circuit.

4. Inductive sensor in accordance with claim 1 wherein the energy storage device is at least one capacitor or comprises at least one capacitor.

5. Inductive sensor in accordance with claim 1, comprising an activation device which activates the transfer device with regard to the energy storage in the energy storage device.

6. Inductive sensor in accordance with claim 5, comprising a phase separation device which is signal-operatively connected to the activation device and which checks whether the measuring phase is completed and, when the measuring phase is detected to be completed, performs at least one of (i) communicating this to the activation device, and (ii) in accordance with a specification, communicating to the activation device that the relaxation phase is present.

7. Inductive sensor in accordance with claim 1, wherein the evaluation device in the measuring phase checks a voltage threshold at oscillations and in particular counts a number of oscillation periods until reaching the voltage threshold.

8. Inductive sensor in accordance with claim 1, wherein in the measuring phase a first supply voltage is applied at the at least one resonant circuit and in the relaxation phase a second supply voltage is applied at the at least one resonant circuit, and in particular the second supply voltage is a full operating voltage.

9. Inductive sensor in accordance with claim 8, wherein the second supply voltage is greater than the first supply voltage.

10. Inductive sensor in accordance with claim 1, wherein at least one of the evaluation device and a phase separation device which checks whether the measuring phase is completed and an activation device which activates the transfer device with regard to the energy storage and a voltage increasing device which in the relaxation phase effects a voltage increase at the resonant circuit are integrated into a microcontroller or ASIC.

11. Inductive sensor in accordance with claim 10, wherein the transfer device is separate from the microcontroller or ASIC and is connected thereto.

12. Inductive sensor in accordance with claim 1, wherein the at least one resonant circuit is connected to an exciter measurement terminal and to a supply voltage terminal of a microcontroller.

13. Inductive sensor in accordance with claim 1, wherein an exciter measurement terminal of a microcontroller or ASIC to which the at least one resonant circuit is connected is of high impedance in the relaxation phase.

14. Inductive sensor in accordance with claim 1, wherein the transfer device comprises at least one of a rectifier circuit and a control circuit which in the relaxation phase of the energy storage device provides oscillation energy at a suitable voltage level.

15. Inductive sensor in accordance with claim 14, wherein the rectifier circuit is connected to an exciter measurement terminal of a microcontroller or ASIC.

16. Inductive sensor in accordance with claim 14, wherein the rectifier circuit is or comprises a Schottky diode.

17. Inductive sensor in accordance with claim 14, wherein the control circuit comprises at least one field effect transistor.

18. Inductive sensor in accordance with claim 15, wherein the control circuit is connected to a control terminal of a microcontroller or ASIC.

19. Inductive sensor in accordance with claim 14, wherein the control circuit is connected to an exciter measurement terminal of a microcontroller or ASIC.

20. Inductive sensor in accordance with claim 19, wherein the control circuit comprises a first switch which controls a second switch, wherein the second switch is connected to the exciter measurement terminal.

21. Inductive sensor in accordance with claim 20, wherein connected upstream of the first switch is an element which makes the first switch conduct only once a certain voltage threshold is exceeded.

22. Inductive sensor in accordance with claim 1, having a configuration as an ultra low power (ULP) device.

23. Inductive sensor, comprising:
a resonant circuit;
an evaluation device which in a measuring phase evaluates oscillations of the at least one resonant circuit for generating sensor signals;
an energy storage device;
a transfer device which in a relaxation phase of the at least one resonant circuit stores oscillation energy of the at least one resonant circuit in the energy storage device; and
a voltage increasing device which in the relaxation phase effects a voltage increase in comparison to the measuring phase.

* * * * *

UNITED STATES PATENT AND TRADEMARK OFFICE
CERTIFICATE OF CORRECTION

PATENT NO. : 10,756,732 B2
APPLICATION NO. : 16/289846
DATED : August 25, 2020
INVENTOR(S) : S. Mahler Page 1 of 1

It is certified that error appears in the above-identified patent and that said Letters Patent is hereby corrected as shown below:

In the Claims

Column 13, Line 9: Claim 18:
"18. Inductive sensor in accordance with claim 15, wherein"
Should read:
-- 18. Inductive sensor in accordance with claim 14, wherein --

Signed and Sealed this
Seventeenth Day of November, 2020

Andrei Iancu
*Director of the United States Patent and Trademark Office*